United States Patent
Endo et al.

(10) Patent No.: US 11,785,855 B2
(45) Date of Patent: Oct. 10, 2023

(54) PIEZOELECTRIC DEVICE, VIBRATION STRUCTURE AND PIEZOELECTRIC SENSOR

(71) Applicant: Murata Manufacturing Co., Ltd., Nagaokakyo (JP)

(72) Inventors: Jun Endo, Nagaokakyo (JP); Junichi Hashimoto, Nagaokakyo (JP); Toru Tominaga, Nagaokakyo (JP); Shozo Otera, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 620 days.

(21) Appl. No.: 16/923,770

(22) Filed: Jul. 8, 2020

(65) Prior Publication Data

US 2020/0335689 A1    Oct. 22, 2020

Related U.S. Application Data

(63) Continuation of application No. PCT/JP2019/045269, filed on Nov. 19, 2019.

(30) Foreign Application Priority Data

Jan. 11, 2019    (JP) .................. 2019-003341

(51) Int. Cl.
  *H10N 30/30*    (2023.01)
  *H10N 30/073*    (2023.01)
  *H10N 30/20*    (2023.01)
  *H10N 30/00*    (2023.01)

(52) U.S. Cl.
  CPC ......... *H10N 30/302* (2023.02); *H10N 30/073* (2023.02); *H10N 30/10513* (2023.02); *H10N 30/2023* (2023.02)

(58) Field of Classification Search
  CPC ........ H10N 30/10513; H10N 30/2043; H10N 30/073; H10N 30/302; H01L 41/081; H01L 41/0913; H01L 41/1132
  See application file for complete search history.

(56) References Cited

U.S. PATENT DOCUMENTS

| | | | |
|---|---|---|---|
| 4,583,017 A | 4/1986 | Nakamura et al. | |
| 2015/0042210 A1* | 2/2015 | Nagareda | B06B 1/0644 29/25.35 |
| 2015/0102707 A1* | 4/2015 | Hori | H10N 30/073 310/348 |

FOREIGN PATENT DOCUMENTS

| | | | | |
|---|---|---|---|---|
| CN | 105556268 A | * | 5/2016 | .............. G01L 1/16 |
| JP | S60232711 A | | 11/1985 | |
| JP | H0984193 A | * | 3/1997 | |

(Continued)

OTHER PUBLICATIONS

Written Opinon of the International Searching Authority issued for PCT/JP2019/045269, dated Feb. 18, 2020.

(Continued)

*Primary Examiner* — J. San Martin
(74) *Attorney, Agent, or Firm* — ArentFox Schiff LLP

(57) ABSTRACT

A piezoelectric device that includes a film that has a first main surface and a second main surface, and has piezoelectricity; a first substrate; and a first connection member that connects the film to the first substrate. The first connection member is a thermosetting resin, and a curing temperature of the first connection member is lower than a temperature at which the film thermally contracts.

15 Claims, 4 Drawing Sheets

(56) References Cited

FOREIGN PATENT DOCUMENTS

| JP | 2007312157 A | 11/2007 |
| JP | 201050796 A | 3/2010 |
| JP | 2011192665 A | 9/2011 |
| JP | 2012107968 A | 6/2012 |
| JP | 2016042761 A | 3/2016 |
| JP | 201650877 A | 4/2016 |
| JP | 2016140009 A | 8/2016 |
| JP | 2017199858 A | 11/2017 |

OTHER PUBLICATIONS

International Search Report issued for PCT/JP2019/045269, dated Feb. 18, 2020.

* cited by examiner

US 11,785,855 B2

PIEZOELECTRIC DEVICE, VIBRATION STRUCTURE AND PIEZOELECTRIC SENSOR

CROSS REFERENCE TO RELATED APPLICATIONS

The present application is a continuation of International application No. PCT/JP2019/045269, filed Nov. 19, 2019, which claims priority to Japanese Patent Application No. 2019-003341, filed Jan. 11, 2019, the entire contents of each of which are incorporated herein by reference.

FIELD OF THE INVENTION

The present invention relates to a piezoelectric device, a vibration structure, and a piezoelectric sensor.

BACKGROUND OF THE INVENTION

In the related art, a film having piezoelectricity is sometimes used by being bonded and fixed to a substrate or the like using an adhesive.

For example, Japanese Patent Application Laid-Open No. 2017-199858 (Patent Document 1) discloses a piezoelectric actuator in which a piezoelectric body is bonded to a substrate using a thermosetting resin as an adhesive.

SUMMARY OF THE INVENTION

However, a temperature at which a ceramic piezoelectric body is bonded is high, and in a case where a piezoelectric film or the like made of an organic material or the like is used for the ceramic piezoelectric body, the piezoelectric film may be denatured due to heat at a temperature lower than that of the curing temperature of the thermosetting resin (for example, about 150 degrees C.).

Therefore, an object of the present invention is to provide a piezoelectric device, a vibration structure, and a piezoelectric sensor that can suppress denaturation due to heat when a film is bonded to a substrate or the like.

A piezoelectric device based on the present invention includes a film that has a first main surface and a second main surface, and has piezoelectricity; a first substrate; and a first connection member that connects the film to the first substrate. The first connection member is a thermosetting resin, and a curing temperature of the first connection member is lower than a temperature at which the film thermally contracts.

A vibration structure based on the present invention includes the piezoelectric device, a vibration portion, and a support portion. The film is constructed to be deformed in a plane direction when a voltage is applied thereto, and the first substrate is a frame-shaped member. The vibration portion is surrounded by the frame-shaped member in a plan view of the vibration structure, a second connection member connects the film to the vibration portion such that the vibration portion vibrates in the plane direction when the film is deformed in the plane direction. The support portion connects and supports the vibration portion within the frame-shaped member.

A piezoelectric sensor based on the present invention includes the piezoelectric device; a second substrate between the first substrate and the film; and a second connection member that connects the first substrate to the second substrate. The first connection member connects the film to the first substrate via the second substrate.

With a piezoelectric device, a vibration structure, and a piezoelectric sensor which are based on the present invention, it is possible to bond a film and a substrate while suppressing denaturation of the film due to heat.

DETAILED DESCRIPTION OF THE INVENTION

Figure 1A:
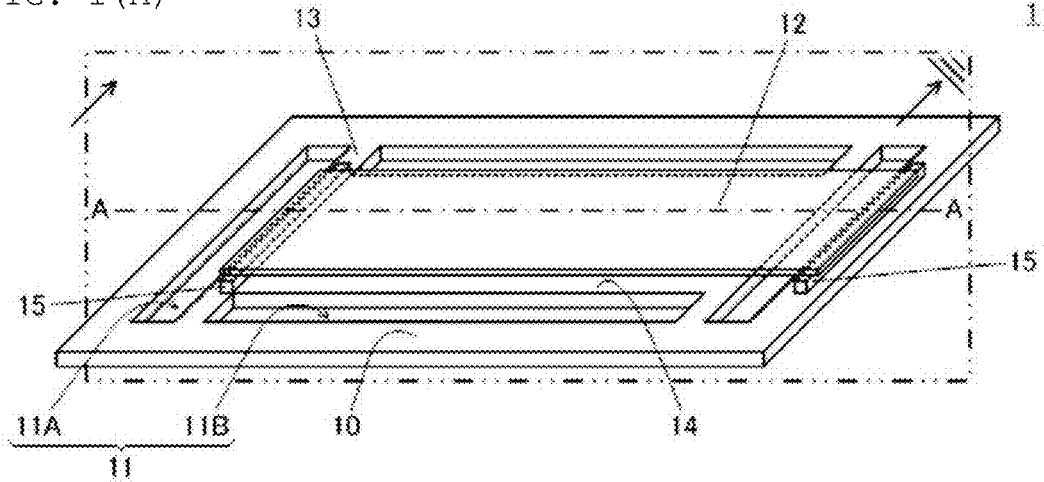
FIG. 1(A) is a perspective view of a vibration structure 1.
Figure 1B:
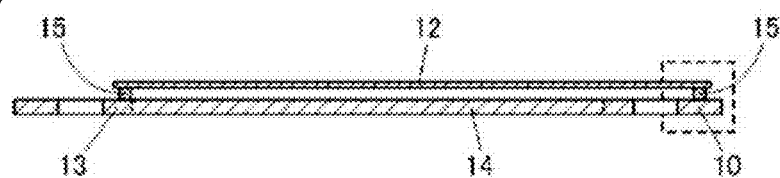
FIG. 1(B) is a cross-sectional view of the vibration structure 1.
Figure 1C:
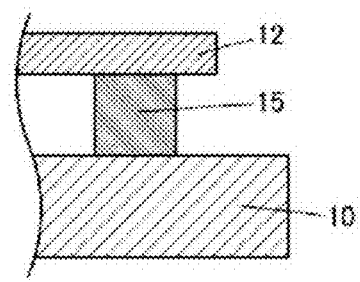
FIG. 1(C) is a partially enlarged view of FIG. 1(B).

FIG. 1(A) is a perspective view of a vibration structure 1 according to a first embodiment of the present invention, FIG. 1(B) is a cross-sectional view of the vibration structure 1 taken along line A-A of FIG. 1(A). FIG. 1(C) is an enlarged view of a connection portion between a piezoelectric film 12 and a frame-shaped member 10 in FIG. 1(B).

The vibration structure 1 includes the frame-shaped member 10, a region 11 surrounded by the frame-shaped member 10, the piezoelectric film 12, a support portion 13, a vibration portion 14, and a first connection member 15.

The frame-shaped member 10 has a rectangular shape in a plan view thereof, and has the region 11 surrounded by the frame-shaped member 10. In the region 11 surrounded by the frame-shaped member 10, the support portion 13 and the vibration portion 14 are disposed. In the region 11 surrounded by the frame-shaped member 10, two first openings 11A disposed at both ends of the frame-shaped member 10 in a longitudinal direction and two second openings 11B disposed at both ends of the frame-shaped member 10 in a short direction are formed by the support portion 13 and the vibration portion 14. The first opening 11A has a rectangular shape, and has a long shape along the short direction of the frame-shaped member 10. The second opening 11B has a rectangular shape, and has a long shape along the longitudinal direction of the frame-shaped member 10.

The vibration portion 14 has a rectangular shape in a plan view thereof, and is disposed in the region 11 surrounded by the frame-shaped member 10. The area of the vibration portion 14 is smaller than the area of the region 11 surrounded by the frame-shaped member 10.

The support portion 13 connects the vibration portion 14 and the frame-shaped member 10 so that the vibration portion 14 is supported by the frame-shaped member 10. In this example, the support portion 13 has a rectangular shape that is long along the short direction of the frame-shaped member 10 that is a direction orthogonal to a direction in which the piezoelectric film 12 expands and contracts, and the support portions 13 hold the vibration portion 14 at both ends of the vibration portion 14 in the longitudinal direction.

In this example, the frame-shaped member 10, the vibration portion 14, and the support portion 13 are formed of the same material (for example, acrylic resin, PET, polycarbonate (PC), glass epoxy, FRP, metal, glass, or the like). That is, the frame-shaped member 10, the vibration portion 14, and the support portion 13 are formed by punching a single rectangular-shaped plate member along the shapes of the first openings 11A and the second openings 11B. The frame-shaped member 10, the vibration portion 14, and the support portion 13 may be formed of different materials, but can be easily manufactured by being formed of the same material. Alternatively, by forming the frame-shaped member 10, the vibration portion 14, and the support portion 13 using the same material, it is not necessary to use another material (material having creep deterioration) such as rubber for supporting the vibration portion 14, and it is possible to hold the vibration portion 14 for a long period of time. Further, in a case where punching is performed on the same material, the natural vibration periods of a plurality of support portions 13 are exactly the same, so that it is possible to reduce the vibration variation of the vibration portion 14 when the vibration portion 14 is vibrated. However, in the present invention, these members need not be formed of the same material. For example, in a case where different materials are used for the plurality of support portions 13, it is possible to adjust the movement of the vibration portion 14. For example, when a material having a high elastic coefficient such as rubber is used for the support portion 13, it is possible to reduce the magnitude of the voltage applied to the piezoelectric film 12.

The piezoelectric film 12 is connected to the frame-shaped member 10 and the vibration portion 14. The piezoelectric film 12 is a film that is deformed in the plane direction when a voltage is applied. The piezoelectric film 12 has a rectangular shape that is long along the longitudinal direction of the frame-shaped member 10 in the plan view. The piezoelectric film 12 is made of, for example, polyvinylidene fluoride (PVDF). Further, the piezoelectric film 12 may be made of a chiral polymer. As the chiral polymer, for example, poly-L-lactide (PLLA) or poly-D-lactide (PDLA) is used.

In a case where PVDF is used for the piezoelectric film 12, since PVDF has water resistance, it is possible to cause electronic equipment including the vibration member in this example to vibrate similarly under any humidity environment.

In addition, in a case where PLLA is used for the piezoelectric film 12, since PLLA is a highly transmissive material, if the electrodes and the vibration portion to be added to PLLA are transparent materials, the internal state of the equipment can be visually recognized, and thus manufacturing becomes easy. Further, since PLLA has no pyroelectricity, it is possible to cause the piezoelectric film to vibrate similarly under any temperature environment.

For example, in a case where the piezoelectric film 12 is made of PLLA, the piezoelectric film 12 has piezoelectricity by being cut such that each outer periphery is approximately 45° with respect to the stretching direction.

A first end of the piezoelectric film 12 in the longitudinal direction is connected to a first end of the frame-shaped member 10 in the longitudinal direction. A second end of the piezoelectric film 12 is connected to a second end of the vibration portion 14 in the longitudinal direction.

As illustrated in FIGS. 1(B) and 1(C), the piezoelectric film 12 is connected to the frame-shaped member 10 and the vibration portion 14 with the first connection member 15 interposed therebetween. The frame-shaped member 10 has a rectangular shape that is long along the short direction in the plan view. The first connection member 15 has a certain thickness, and connects the piezoelectric film 12 and the vibration portion 14 at a certain distance such that the piezoelectric film 12 does not come into contact with the vibration portion 14. In this manner, it is difficult for the electrodes (not illustrated) provided on both main surfaces of the piezoelectric film 12 to come into contact with the vibration portion 14, so that even if the piezoelectric film 12 expands and contracts and the vibration portion 14 vibrates, the electrodes can be prevented from being scraped.

The first connection member 15 is made of a thermosetting resin. The thermosetting resin used for the first connection member 15 is a thermosetting resin having a curing temperature of 130 degrees C. or less.

PLLA or PVDF used for the piezoelectric film 12 undergo reduction or loss of piezoelectricity and inverse piezoelectricity due to thermal contraction and a change in molecular arrangement at a temperature of about 150 degrees C. Therefore, in a case where the curing temperature of the thermosetting resin used for the first connection member 15 is about 150 degrees C., the function of the piezoelectric film may be impaired.

For example, in a case where the piezoelectric film 12 is formed of PVDF, thermal contraction occurs at a temperature of 130 degrees C. or more, and the contraction of the piezoelectric film 12 may not be sufficiently transmitted to the frame-shaped member 10 and the vibration portion 14.

That is, the first connection member 15 is preferably made of a thermosetting resin that cures at 130 degrees C. or less.

Depending on the material and characteristics of the piezoelectric film 12 used, the curing temperature of the thermosetting resin may be set not to exceed the selected reference temperature, based on the Curie temperature, a melting point, a thermal contraction temperature, a temperature below a predetermined elastic modulus, or the like.

In that case, if the curing temperature of the thermosetting resin used for the first connection member 15 is lower than a predetermined selected reference temperature, bonding with the vibration portion 14 and the frame-shaped member 10 becomes possible while suppressing the deterioration of the characteristics of the piezoelectric film 12. That is, in this manner, it is possible to bond the piezoelectric film 12 to the frame-shaped member 10 as a first substrate while suppressing the denaturation of the piezoelectric film 12 due to heat.

Further, the first connection member 15 may be configured by two or more different members. In this case, it is possible to stabilize the vibration of the vibration structure 1 by appropriately selecting a combination of members according to the stress applied to the first connection member 15 and the like.

Further, the first connection member 15 may be made of a silicon-based adhesive. In this case, the change in elastic modulus with respect to the temperature change of the silicone-based adhesive is smaller than that of other acrylic-based adhesives, so that the vibration of the vibration structure 1 is stabilized.

Figure 2:
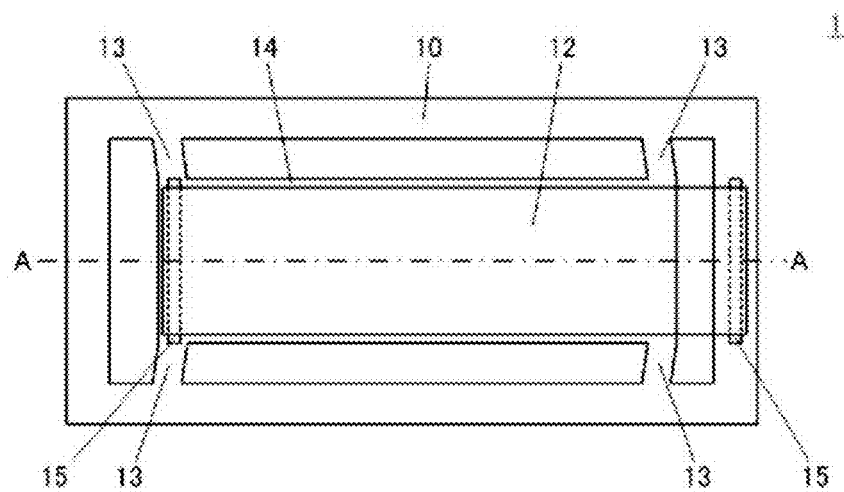
FIG. 2 is a plan view of the vibration structure 1.

FIG. 2 is a plan view of the vibration structure 1. The piezoelectric film 12 has plane electrodes formed on both main surfaces. The plane electrodes are connected to a drive circuit (not illustrated). The drive circuit applies a voltage to the plane electrodes to cause the piezoelectric film 12 to expand and contract. For example, in a case where the drive circuit applies a negative voltage to the piezoelectric film 12 and the piezoelectric film 12 contracts, as illustrated in FIG. 2, the vibration portion 14 is displaced in the longitudinal direction (rightward in the drawing). Since the first connection member 15 is very thin, the first connection member 15 transmits a force without being substantially deformed. Therefore, when the piezoelectric film 12 contracts, the vibration portion 14 is easily displaced.

When the drive circuit applies, for example, a positive voltage to the piezoelectric film 12, the piezoelectric film 12 expands. However, even if the piezoelectric film 12 expands, only the piezoelectric film 12 is bent, and it is difficult to displace the vibration portion 14. Therefore, the drive circuit mainly applies a negative voltage to the piezoelectric film 12 to cause the piezoelectric film 12 to expand and contract, thereby vibrating the vibration portion 14. In a case where the piezoelectric film 12 is connected while being tensioned, when the piezoelectric film 12 is stretched, the support portion 13 which has been bent by the initial tension tries to return to the original state so that the vibration portion 14 is displaced. Here, the piezoelectric film 12 may expand when a negative charge is applied, and may contract when a positive charge is applied.

The application of the voltage as described above is repeatedly performed. That is, the drive circuit applies an AC voltage. The drive waveform may be any waveform such as a rectangular wave, a triangular wave, and a trapezoidal wave. For example, when a sine wave is applied, unnecessary vibration can be reduced, and sound generated by the unnecessary vibration can be reduced.

The vibration structure 1 vibrates in the plane direction within the region 11 of the frame-shaped member 10 where the vibration portion 14 is surrounded by the frame-shaped member 10. Therefore, as illustrated in FIG. 1(B), the entire thickness of the vibration structure 1 is only the thickness of the piezoelectric film 12, the thickness of the first connection member 15, and the thickness of the vibration portion 14, and becomes extremely thin. Further, the piezoelectric film 12 is elastic and has impact resistance. Further, in a case where the frame-shaped member 10, the vibration portion 14, and the support portion 13 are formed of a single rectangular-shaped plate material, it is not necessary to use another material (material having creep deterioration) such as rubber for supporting the vibration portion 14. Therefore, according to the structure of the vibration structure 1, stable vibration can be performed for a long period of time.

The shape of the vibration portion 14 is not limited to the shape illustrated in FIG. 2. The frame-shaped member 10 does not need to have an annular shape that surrounds the entire periphery in the plan view, and may have a partially open structure. Further, the frame-shaped member 10 and the vibration portion 14 do not need to have a rectangular shape in the plan view. The frame-shaped member 10 and the vibration portion 14 may have a polygonal shape, a circular shape, an elliptical shape, or the like.

As described above, the vibration structure 1 has been described as an example using the piezoelectric film 12, but the configuration of the present invention can be used when a film having piezoelectricity and a substrate are bonded to each other using a thermosetting resin in a piezoelectric device including a film having piezoelectricity and a substrate such as the frame-shaped member 10 and the vibration portion 14.

For example, the piezoelectric film 12 can be used not only for a vibration structure but also for a piezoelectric sensor.

In that case, the piezoelectric film 12 is bonded to a substrate or the like using a thermosetting resin as in the case of the vibration structure 1. In this case, as the thermosetting resin, it is desirable to use a thermosetting resin that cures at a temperature of 130 degrees C. or less as in the case of the vibration structure 1. According to this configuration, it is possible to provide a sensor that suppresses denaturation of the piezoelectric film 12 due to heat.

Figure 3A:
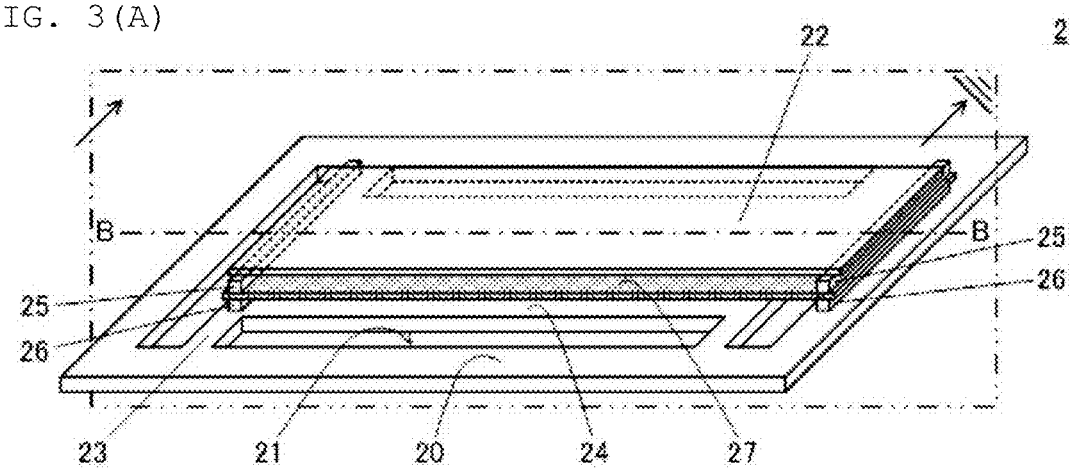
FIG. 3(A) is a perspective view of a vibration structure 2.
Figure 3B:
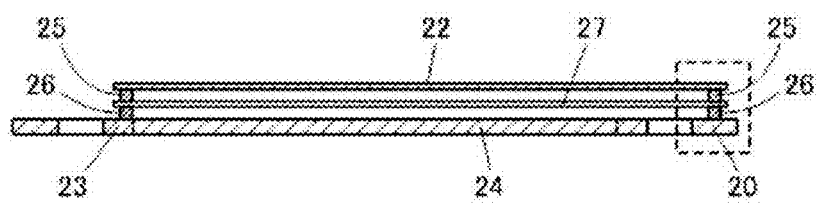
FIG. 3(B) is a cross-sectional view of the vibration structure 2.
Figure 3C:
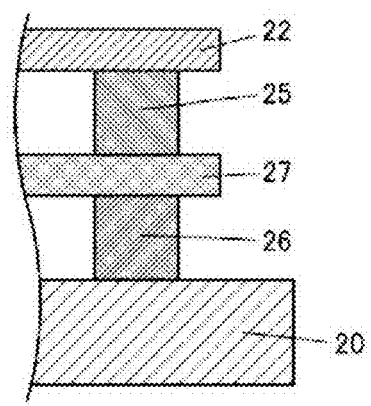
FIG. 3(C) is a partially enlarged view of FIG. 3(B).

FIG. 3(A) is a perspective view of a vibration structure 2 according to a second embodiment of the present invention, FIG. 3(B) is a cross-sectional view of the vibration structure 2 taken along line B-B of FIG. 3(A). FIG. 3(C) is an enlarged view of a connection portion between a piezoelectric film 22 and a frame-shaped member 20 in FIG. 3(B).

The vibration structure 2 includes the frame-shaped member 20, a region 21 surrounded by the frame-shaped member 20, the piezoelectric film 22, a support portion 23, a vibration portion 24, a first connection member 25, a second connection member 26, and a surface substrate 27.

The vibration structure 2 is different from the vibration structure 1 in that the vibration structure 2 includes the surface substrate 27 and the second connection member 26. Therefore, the description of the same structure as the vibration structure 1 will be omitted below.

The first connection member 25 is made of a thermosetting resin, and the curing temperature thereof is a temperature lower than a temperature at which the piezoelectric film 22 is denatured due to heat or a melting point. For example, in a case where the temperature at which the piezoelectric film 22 is denatured due to heat is 150 degrees C., the curing temperature is 130 degrees C.

The surface substrate 27 is connected to the piezoelectric film 22 by the first connection member 25. Further, the surface substrate 27 is connected to the frame-shaped member 20 with the second connection member 26 interposed therebetween.

For the surface substrate 27, an insulating member such as polyimide is used. The second connection member 26 is formed of a thermosetting resin similarly to the first connection member 25. The curing temperature of the thermosetting resin used for the second connection member 26 is higher than the curing temperature of the thermosetting resin used for the first connection member 25.

In a case where the frame-shaped member 20 is made of a metal member such as SUS, a curable resin that cures at a relatively low temperature such as a thermosetting resin used for the first connection member 25 has lower elastic modulus as compared with the thermosetting resin that cures at a high temperature, and the bonding with the vibration portion 24 may be weak.

Therefore, using the surface substrate 27, the surface substrate 27 and the piezoelectric film 22 are connected by the first connection member 25 that cures at a relatively low temperature, and the surface substrate 27 and the frame-shaped member 20 are connected by the second connection member 26 that cures at a higher temperature than the first connection member 25, thereby connecting the piezoelectric film 22 and the frame-shaped member 20.

Further, in a case where the piezoelectric film 22 and the frame-shaped member 20 are connected with the second connection member 26 and the surface substrate 27 interposed therebetween, the elastic modulus of the entire connecting portion is increased as compared with a case where the piezoelectric film and the frame-shaped member are connected by only the first connection member 25, it is possible to prevent the vibration of the piezoelectric film 22 from being absorbed and relaxed at the connection portion.

In the above configuration, the connection portion between the piezoelectric film 22 and the frame-shaped member 20 has been described, but the present invention is not limited to this, and a similar configuration may be adopted at the connection portion between the piezoelectric film 22 and the vibration portion 24.

That is, the surface substrate 27 and the vibration portion 24 are bonded by a thermosetting resin, and the curing temperature thereof is higher than the curing temperature of the thermosetting resin used for bonding the piezoelectric film 22 to the surface substrate 27.

Similarly to the connection portion between the piezoelectric film 22 and the frame-shaped member 20, also in the connection portion between the piezoelectric film 22 and the vibration portion 24, the curing temperature of the thermosetting resin for bonding the surface substrate 27 and the vibration portion 24 is set to be higher than the curing temperature of the thermosetting resin for bonding the piezoelectric film 22 and the surface substrate 27, so that the vibration portion 24 and the frame-shaped member 20 can be more reliably connected to the piezoelectric film 22.

The surface substrate 27 is formed of an insulating member. In a case where the surface substrate 27 is formed of an insulating substrate, when electrodes are formed on the piezoelectric film 22, the direct contact between the electrodes on the piezoelectric film 22 and the vibration portion 24 in accordance with the expansion and contraction of the piezoelectric film 22 is prevented by the presence of the surface substrate 27. That is, even in a case where the vibration portion 24 is formed of metal, it is possible to suppress a short circuit between the vibration portion 24 and the electrodes on the piezoelectric film 22.

Similarly to the configuration of the vibration structure 1, for this configuration, the configuration of the present invention can be used when a film having piezoelectricity and a substrate are bonded to each other using a thermosetting resin in a piezoelectric device including a film having piezoelectricity and a substrate such as the frame-shaped member 20 and the vibration portion 24.

In a case where the configuration of the vibration structure 2 is used for, for example, a sensor having piezoelectricity, it is possible to perform bonding to the substrate without impairing the characteristics of the film having piezoelectricity.

That is, a piezoelectric film, an insulating surface substrate, and a metal substrate are provided; the piezoelectric film and the surface substrate are bonded to each other using a thermosetting resin; the surface substrate and the substrate are bonded to each other using a thermosetting resin; and the curing temperature of the thermosetting resin for bonding the piezoelectric film to the surface substrate is lower than the curing temperature of the thermosetting resin for bonding the surface substrate to the substrate.

With this configuration, the piezoelectric film can be reliably bonded to the metal substrate. Further, the substrate is not limited to a metal substrate and may be made of resin or the like.

Figure 4A:
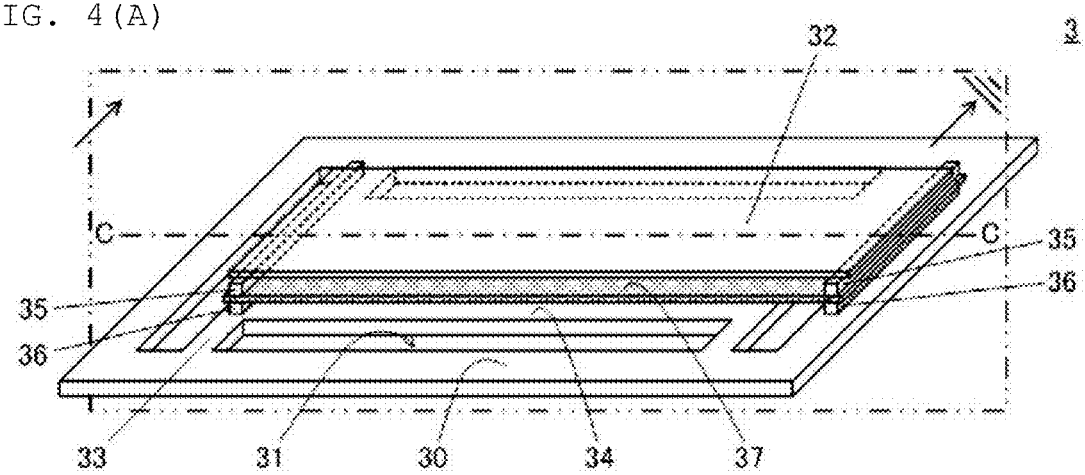
FIG. 4(A) is a perspective view of a vibration structure 3.
Figure 4B:
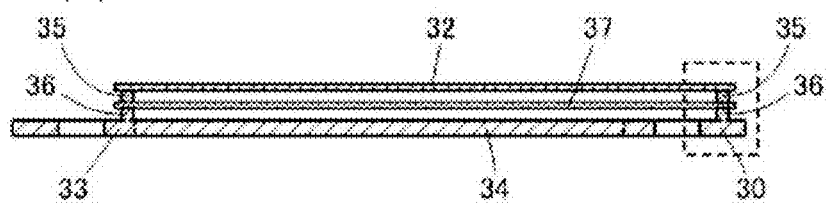
FIG. 4(B) is a cross-sectional view of the vibration structure 3.
Figure 4C:
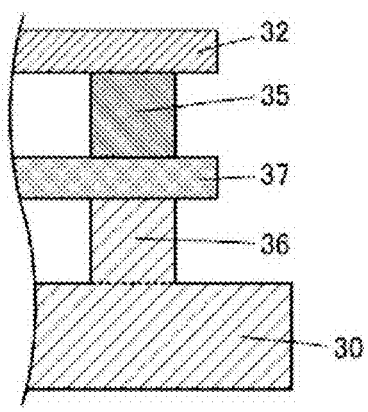
FIG. 4(C) is a partially enlarged view of FIG. 4(B).

FIG. 4(A) is a perspective view of a vibration structure 3 according to a third embodiment of the present invention, FIG. 4(B) is a cross-sectional view of the vibration structure 3 taken along line C-C of FIG. 4(A). FIG. 4(C) is an enlarged view of a connection portion between a piezoelectric film 32 and a frame-shaped member 30 in FIG. 4(B).

As illustrated in FIG. 4(A), the vibration structure 3 includes the frame-shaped member 30, a region 31 surrounded by the frame-shaped member 30, the piezoelectric film 32, a support portion 33, a vibration portion 34, a first connection member 35, a second connection member 36, and a surface substrate 37.

Since the vibration structure 3 is different from the vibration structure 2 in that the second connection member 36 and the frame-shaped member 30 are formed integrally, the description of the same structure in the vibration structure 3 and the vibration structure 2 will be omitted.

FIG. 4(B) is a cross-sectional view of the vibration structure 3 in FIG. 4(A), and is an enlarged view of a connection portion between the piezoelectric film 32 and the frame-shaped member 30.

As illustrated in FIG. 4(B), the second connection member 36 and the frame-shaped member 30 are formed integrally. In this case, the frame-shaped member 30 and the second connection member 36 are formed of, for example, a thermosetting resin, and are bonded to the surface substrate 37.

The curing temperature of the thermosetting resin used for the frame-shaped member 30 and the second connection member 36 is higher than the curing temperature of the thermosetting resin used for the first connection member 35.

With this configuration, the frame-shaped member 30 and the second connection member 36 can be reliably bonded to the surface substrate 37, and the surface substrate 37 and the piezoelectric film 32 can be reliably bonded to each other.

Further, since the frame-shaped member 30 and the second connection member 36 are formed integrally, the number of components in the overall configuration is reduced, and the manufacturing process can be simplified, and the cost can be reduced.

In FIG. 4(B), the connection portion between the piezoelectric film 32 with the frame-shaped member is illustrated, but the invention is not limited thereto, and similarly, also in the connection portion between the piezoelectric film 32 and the vibration portion 34, the vibration portion 34 and the second connection member 36 that connects the vibration portion 34 and the surface substrate 37 may be formed integrally.

In this case, it is desirable that the vibration portion 34 and the frame-shaped member 30 are formed integrally, and are formed of the same thermosetting resin.

With this configuration, it is possible to further suppress the occurrence of peeling or displacement at the connection portion between the frame-shaped member 30 and the vibration portion 34, and the piezoelectric film 32 in the vibration structure 3.

Further, the number of components can be further reduced, the manufacturing process can be further reduced, and the cost can be further reduced.

Figure 5A:
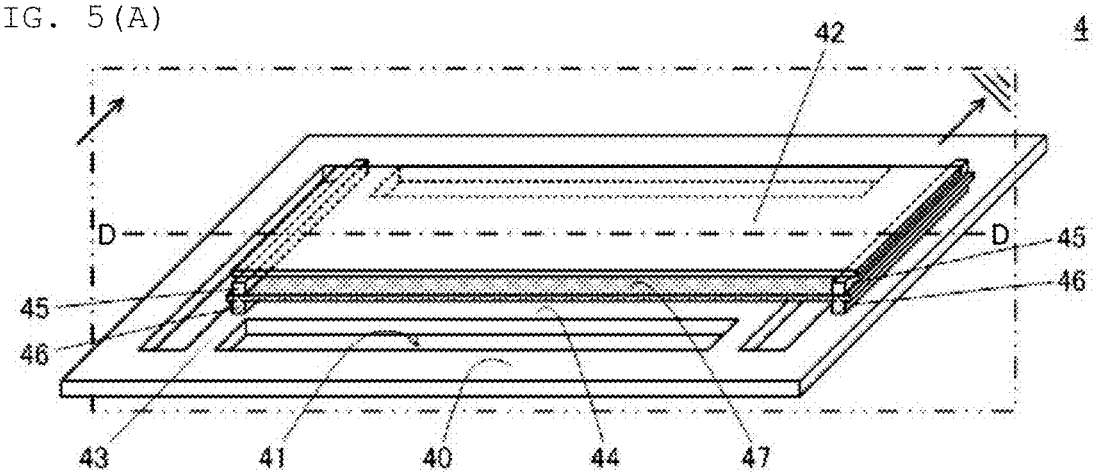
FIG. 5(A) is a perspective view of a vibration structure 4.
Figure 5B:
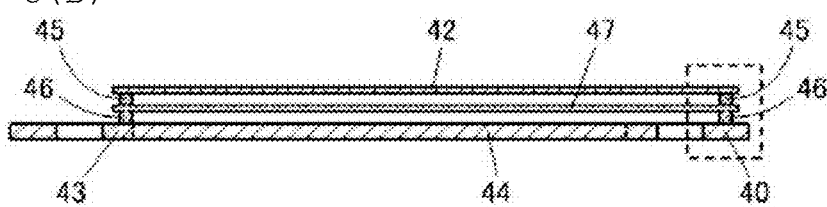
FIG. 5(B) is a cross-sectional view of the vibration structure 4.
Figure 5C:
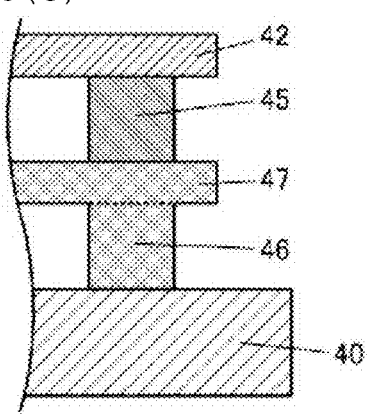
FIG. 5(C) is a partially enlarged view of FIG. 5(B).

FIG. 5(A) is a perspective view of a vibration structure 4 according to a fourth embodiment of the present invention, FIG. 5(B) is a cross-sectional view of the vibration structure 4 taken along line D-D of FIG. 5(A). FIG. 5(C) is an enlarged view of a connection portion between a piezoelectric film 42 and a frame-shaped member 40 in FIG. 5(B).

As illustrated in FIG. 5(A), the vibration structure 4 includes the frame-shaped member 40, a region 41 surrounded by the frame-shaped member 40, the piezoelectric film 42, a support portion 43, a vibration portion 44, a first connection member 45, a second connection member 46, and a surface substrate 47.

Since the vibration structure 4 is different from the vibration structure 2 in that the second connection member 46 and the surface substrate 47 are formed integrally, the description of the same structure in the vibration structure 4 and the vibration structure 2 will be omitted.

FIG. 5(B) is a cross-sectional view of the vibration structure 4 in FIG. 5(A), and is an enlarged view of a connection portion between the piezoelectric film 42 and the frame-shaped member 40.

As illustrated in FIG. 5(B), the second connection member 46 and the surface substrate 47 are formed integrally. In this case, the surface substrate 47 and the second connection member 46 are formed of, for example, a thermosetting resin, and are bonded to the frame-shaped member 40.

The curing temperature of the thermosetting resin used for the surface substrate 47 and the second connection member 46 is higher than the curing temperature of the thermosetting resin used for the first connection member 45.

With this configuration, the surface substrate 47 and the second connection member 46 can be reliably bonded to the frame-shaped member 40, and the surface substrate 47 and the second connection member 46 can be reliably bonded to the piezoelectric film 42.

It is possible to suppress the occurrence of peeling or displacement at the connection portion between the surface substrate 47 and the second connection member 46.

Further, since the surface substrate 47 and the second connection member 46 are formed integrally, the number of components in the overall configuration is reduced, the manufacturing process can be simplified, and the cost can be reduced.

In FIG. 5(B), the connection portion between the piezoelectric film 42 with the frame-shaped member is illustrated, but the invention is not limited thereto, and similarly, also in the connection portion between the piezoelectric film 42 and the vibration portion 44, the surface substrate 47 and the second connection member 46 that connects the vibration portion 44 and the surface substrate 47 may be formed integrally.

With this configuration, it is possible to further suppress the occurrence of peeling or displacement at the connection portion between the surface substrate 47 and the piezoelectric film 32 in the vibration structure 4.

Further, the number of components can be further reduced, the manufacturing process can be further reduced, and the cost can be further reduced.

The characteristic configurations in the first to fourth embodiments of the present invention described above can be combined with each other without departing from the gist of the present invention.

The embodiments disclosed here are examples in all respects, and are not restrictive. The technical scope of the present invention is defined by the claims, and includes all modifications within the meaning and scope equivalent to the description of the claims.

DESCRIPTION OF REFERENCE SYMBOLS

1: vibration structure
10: frame-shaped member
11: region surrounded by frame-shaped member
12: piezoelectric film
13: support portion
14: vibration portion
15: first connection member
26: second connection member
27: surface substrate

The invention claimed is:

1. A vibration structure comprising:
a piezoelectric device comprising:
   a film that has a first main surface and a second main surface, and has piezoelectricity;
   a first substrate; and
   a first connection member that connects the film to the first substrate,
   wherein the first connection member is a thermosetting resin,
   a curing temperature of the first connection member is lower than a temperature at which the film thermally contracts,
   the film is constructed to be deformed in a plane direction when a voltage is applied thereto, and
   the first substrate is a frame-shaped member, and
the vibration structure further comprises:
   a vibration portion surrounded by the frame-shaped member in a plan view of the vibration structure;
   a second connection member that connects the film to the vibration portion such that the vibration portion vibrates in the plane direction when the film is deformed in the plane direction; and
   a support portion connecting and supporting the vibration portion within the frame-shaped member.

2. The vibration structure according to claim 1, wherein the curing temperature of the first connection member is 130 degrees C. or lower.

3. The vibration structure according to claim 1, wherein the thermosetting resin is a silicon-based adhesive.

4. The vibration structure according to claim 1, wherein the second connection member is a thermosetting resin, and
   a curing temperature of the second connection member is lower than the temperature at which the film thermally contracts.

5. The vibration structure according to claim 1, further comprising:
   a surface substrate disposed between the frame-shaped member and the film; and
   a third connection member that connects the surface substrate to the frame-shaped member,
   wherein the first connection member connects the film to the first substrate via the surface substrate.

6. The vibration structure according to claim 5,
   wherein the third connection member is a thermosetting resin, and
   a curing temperature of the third connection member is higher than the curing temperature of the first connection member.

7. The vibration structure according to claim 5, wherein the frame-shaped member and the third connection member are integral.

8. The vibration structure according to claim 5, wherein the third connection member and the surface substrate are integral.

9. The vibration structure according to claim 1, wherein the frame-shaped member, the vibration portion, and the support portion are formed of a same material.

10. A piezoelectric sensor comprising:
a piezoelectric device comprising:
   a film that has a first main surface and a second main surface, and has piezoelectricity;
   a first substrate; and
   a first connection member that connects the film to the first substrate,
   wherein the first connection member is a thermosetting resin, and
   a curing temperature of the first connection member is lower than a temperature at which the film thermally contracts;
a second substrate between the first substrate and the film; and
a second connection member that connects the first substrate to the second substrate,
wherein the first connection member connects the film to the first substrate via the second substrate.

11. The piezoelectric sensor according to claim 10,
wherein the second connection member is a thermosetting resin, and
a curing temperature of the second connection member is higher than the curing temperature of the first connection member.

12. The piezoelectric sensor according to claim 11, wherein the curing temperature of the first connection member is 130 degrees C. or lower.

13. The piezoelectric sensor according to claim 11, wherein the thermosetting resin of the first connection member is a silicon-based adhesive.

14. The piezoelectric sensor according to claim 10, wherein the curing temperature of the first connection member is 130 degrees C. or lower.

15. The piezoelectric sensor according to claim 10, wherein the thermosetting resin of the first connection member is a silicon-based adhesive.

* * * * *